(12) United States Patent
Kim et al.

(10) Patent No.: US 7,095,042 B2
(45) Date of Patent: Aug. 22, 2006

(54) ELECTRODE STRUCTURE, SEMICONDUCTOR LIGHT-EMITTING DEVICE HAVING THE SAME AND METHOD OF MANUFACTURING THE SAME

(75) Inventors: Mi-yang Kim, Gyeonggi-do (KR); Joon-seop Kwak, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 59 days.

(21) Appl. No.: 10/866,257

(22) Filed: Jun. 14, 2004

(65) Prior Publication Data
US 2005/0104074 A1 May 19, 2005

(30) Foreign Application Priority Data
Nov. 4, 2003 (KR) .................. 10-2003-0077791

(51) Int. Cl.
*H01L 29/06* (2006.01)
*H01L 31/0328* (2006.01)
*H01L 31/03336* (2006.01)
*H01L 31/072* (2006.01)
*H01L 31/109* (2006.01)

(52) U.S. Cl. .............. 257/13; 257/79; 257/86; 257/87; 257/94; 257/101; 257/102; 257/103; 257/918; 257/660; 257/661; 257/663; 257/930

(58) Field of Classification Search .............. 257/13, 257/79, 86–87, 94, 101–103, 918; 438/660, 438/661, 663, 930
See application file for complete search history.

(56) References Cited
U.S. PATENT DOCUMENTS 5,898,185 A * 4/1999 Bojarczuk et al. .......... 257/103
6,307,219 B1 * 10/2001 Oku et al. .................. 257/101
6,392,262 B1 * 5/2002 Shiraishi .................... 257/280
6,580,099 B1 * 6/2003 Nakamura et al. .......... 257/103
6,743,526 B1 * 6/2004 Hamada et al. ............. 428/690
7,002,180 B1 * 2/2006 Oh et al. ..................... 257/79
2003/0020085 A1 * 1/2003 Bour et al. .................. 257/101
2004/0094756 A1 * 5/2004 Moon et al. ................. 257/13
2004/0159848 A1 * 8/2004 Yamaguchi et al. ......... 257/94

FOREIGN PATENT DOCUMENTS
JP 10-303504 11/1998

* cited by examiner

*Primary Examiner*—Ida M. Soward

(57) ABSTRACT

A semiconductor light emitting device including a p-type electrode structure and having a low contact resistance and high reflectance is provided. The semiconductor light emitting device includes a transparent substrate, an electron injection layer having first and second regions on the transparent substrate, an active region formed on the first region, a hole injection layer on the active layer, a first electrode structure on the second region, and a second electrode structure on the hole injection layer, and includes a first layer including nitrogen and a second layer including Pd. The low contact resistance and high reflectance can be obtained by forming a trivalent compound layer composed of Pd—Ga—N at an interface between the hole injection layer, which is composed of p-GaN, and the metal layer of the p-type electrode.

8 Claims, 4 Drawing Sheets

ELECTRODE STRUCTURE, SEMICONDUCTOR LIGHT-EMITTING DEVICE HAVING THE SAME AND METHOD OF MANUFACTURING THE SAME

BACKGROUND OF THE INVENTION

This application claims the priority of Korean Patent Application No. 2003-77791 filed on Nov. 4, 2003, in the Korean Intellectual Property Office, the disclosure of which is incorporated herein in its entirety by reference.

1. Field of the Invention

The present invention relates to a method of manufacturing a semiconductor light emitting device using a nitride compound semiconductor, and more particularly, to a high reflectance film electrode structure that has low contact resistance and high reflectance.

2. Description of the Related Art

Generally, nitride compound semiconductors are widely used for visible light emitting devices, and are currently developed to a light emitting device for producing light in the ultra violet region since a light emitting device for producing light in the blue and green light regions has been developed. Also, the nitride compound semiconductors can be used for light sources used in light emitting devices emitting light in a blue, green and ultraviolet region, and in high density light recording devices.

As information recording density increases, a group III-V nitride semiconductor becomes more useful because the such a nitride semiconductor is capable of emitting a visible light laser and has high emission efficiency since a transition in the nitride compound semiconductor producing the light is a direct transition, and moreover, the nitride semiconductor is capable of emitting a blue light that is one of the three primary lights.

It is advantageous that a light emitting device has a low operating voltage. A method widely used for reducing an operating voltage of a light emitting device includes reducing the resistance of a material layer formed between an electrode layer and an active layer. Particularly, to reduce the operating voltage in the nitride compound semiconductor light emitting device, it is desirable to form a low ohmic resistance between a hole injecting layer and a p-type electrode since the hole injecting layer and the p-type electrode are in ohmic contact.

That is, a draw back of the ohmic contact to the p-type electrode is that there is no metal having a larger work function than the p-type GaN. Therefore, an ohmic contact to a p-type GaN is difficult. In order to manufacture a laser diode or a light emitting device having high quality using GaN, an ohmic contact having high thermal stability and low contact resistance must be formed on the p-type GaN.

A cross-sectional view of an electrode structure applied to a conventional nitride semiconductor light emitting device, disclosed in Japanese Patent Laid-Open publication 10-303504 is depicted in FIG. 1.

Referring to FIG. 1, an electrode structure 10 at an interface of a p-type GaN used for a conventional nitride semiconductor light emitting device comprises a sapphire substrate 12, a p-type GaN layer 14, a compound layer 16, and a metal layer 18 stacked sequentially.

In the conventional electrode structure 10, the compound layer 16 is formed by following process. First, the p-type GaN layer 14 is formed on the sapphire substrate 12 using a molecular beam epitaxy (MBE) method, and a surface of the p-type GaN layer 14 is cleaned using ultrasonic waves in acetone or alcohol.

Next, the wafer is heated to 200° C. to increase a bonding strength of the layers to be deposited in vacuum state, a metal layer 18 for electrode is formed using a sputtering method with argon plasma, and the metal layer is annealed for 5 minutes at a temperature of 600° C. in a nitrogen atmosphere. As a result, a compound reaction occurs at the interface between the p-type GaN layer 14 and the metal layer 18, and a compound layer 16 composed of PdGa, $Pd_2Ga_3$ or $Pd_3Ga_2$ is formed.

The conventional electrode structure described above can be a low resistance p-type electrode structure composed of an Au/Pd/Pd—Ga compound suitable for a group III nitride semiconductor device. However, when manufacturing a group III nitride semiconductor device using the p-type electrode structure, there is a drawback in that a surface of the electrode can become very rough.

Therefore, a contact resistance in the electrode surface is not uniform, increases in some regions resulting in an increase of the overall contact resistance, thereby causing an increase of the operating voltage of the device.

Also, the rough surface of the electrode can be a cause of reducing the bonding strength for stacking and assembling bonding metals in a subsequent process, thereby reducing overall yield.

SUMMARY OF THE INVENTION

To solve the above and/or other problems, the present invention provides a semiconductor light emitting device having a p-type electrode structure having a low contact resistance and high reflectance.

The present invention also provides a method of manufacturing a semiconductor light emitting device having an electrode structure having a low contact resistance and high reflectance.

The present invention also provides an electrode structure for a semiconductor light emitting device, the electrode structure having a low contact resistance and a high reflectance.

The present invention also provides a method of manufacturing an electrode structure for a semiconductor light emitting device, the electrode structure having a low contact resistance and high reflectance.

According to an embodiment of the present invention, there is provided a semiconductor light emitting device comprising: a transparent substrate; an electron injection layer having first and second regions formed on the transparent substrate; an active region formed on the first region; a hole injection layer formed on the active layer; a first electrode structure formed on the second region; and a second electrode structure formed on the hole injection layer, and comprising a first layer including nitrogen and a second layer including Pd.

According to another embodiment of the present invention, the first layer of the second electrode structure used for the semiconductor light emitting device which includes the hole injection layer, further comprises Pd and Ga. According to an embodiment of the present invention, there is provided a method of manufacturing a nitride semiconductor light emitting device, comprising: forming an electron injection layer on a transparent substrate; forming an active layer on a first region of the electron injection layer; forming a hole injection layer on the active layer; forming a metal layer on the hole injection layer; forming a compound layer comprising N at an interface between the hole injection layer and the metal layer by annealing the transparent substrate on which the metal layer is formed at a predetermined temperature; and electrically combining a circuit substrate to the metal layer.

According to another embodiment of the present invention, there is provided a method of forming the electrode structure, comprising: forming a semiconductor layer; forming a metal layer on the semiconductor layer; and forming a compound layer comprising N at an interface between the hole injection layer and the metal layer by annealing the transparent substrate on which the metal layer is formed at a predetermined temperature.

The second layer of the second electrode structure can be composed of Pd.

Also, the first layer can be interposed between the hole injection layer and the second layer.

The annealing can be performed for more than 7 minutes at temperature of approximately 450° C.

The hole injection layer can be a p-type material layer or an undoped material layer.

Also, the hole injection layer can be composed of a material selected from the group consisting of n-GaN, GaN, AlGaN, and InGaN.

DETAILED DESCRIPTION OF THE INVENTION

Figure 1:
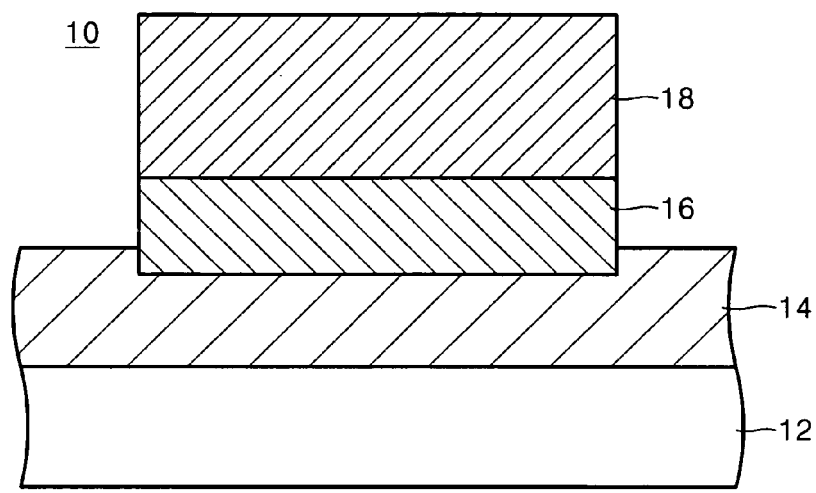
FIG. 1 is a cross-sectional view of a conventional electrode structure.

The present invention will now be described more fully with reference to the accompanying drawings in which embodiments of the present invention are shown. Like reference numerals refer to the like elements throughout the drawings.

Figure 2:
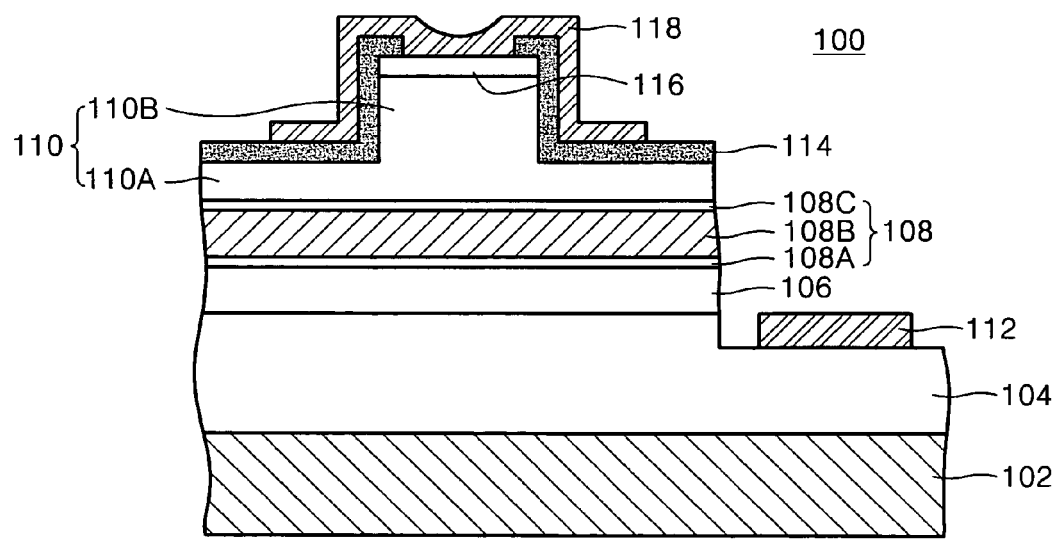
FIG. 2 is a cross-sectional view of a semiconductor light emitting device manufactured according an exemplary embodiment of the present invention.

FIG. 2 is a cross-sectional view of a semiconductor light emitting device manufactured according an exemplary embodiment of the present invention.

Referring to FIG. 2, a semiconductor light emitting device 100 comprises a transparent substrate 102 composed of a transparent material such as sapphire $Al_2O_3$ or silicon carbide SiC, a first compound semiconductor layer 104 composed of a GaN group III-V nitride compound on the transparent substrate 102, and a first clad layer 106 formed of n-AlGaN/GaN, a resonance layer 108, a second clad layer 110, a second compound semiconductor layer 116, and a second electrode 118 are sequentially stacked on the first compound semiconductor layer 104.

According to the present embodiment, the first compound semiconductor layer 104 is an n-type material layer or an undoped material layer, and is an n-GaN layer or a GaN layer. The first compound semiconductor layer 104 can also be an AlGaN layer or an InGaN layer including aluminum or indium in a predetermined ratio. Also, the first compound semiconductor layer 104 is divided into a first region and a second region. On the first region, the first clad layer 106 is formed, and on the second region, an n-type first electrode 112 is formed.

The resonance layer 108 including a first waveguide layer 108a, an active layer 108b, and a second waveguide layer 108c stacked sequentially, is formed on the first clad layer 106.

The active layer 108b generates a laser oscillation by carrier recombination such as electron-hole, and is a GaN group III-V nitride compound semiconductor layer having a multi-quantum well structure. Preferably, the active layer 108b can be an $In_xAl_yGa1-_{x-y}N$ ($0 \leq x \leq 1$, $0 \leq y \leq 1$ and $x+y \leq 1$) layer. The active layer 108b can also be a material layer that includes indium in a predetermined ratio with respect to a GaN group III-V nitride compound semiconductor layer such as an InGaN layer. The first and second waveguide layers 108a and 108c have a lower refractive index than the active layer 108b, but have a higher refractive index than the first and the second clad layer 106 and 110. The first and second waveguide layers 108a and 108c can be an n-GaN layer and p-GaN layer, respectively, as GaN group III-V nitride compound layers.

The second clad layer 110 and the second compound semiconductor layer 116 are stacked sequentially on the resonance layer 108. The second compound semiconductor layer 116 affects the active layer 108b to cause a stimulated emission required for stimulating laser emission by the active layer 108b.

The second clad layer 110 includes a protrusion portion 110b as a ridge on a portion corresponding to a central portion of the resonance layer 108, and a portion 110a thinner than the protrusion portion 110b and symmetrical about the protrusion portion 110b. The second compound semiconductor layer 116 is formed on the protrusion portion 110b of the second clad layer 110. The second clad layer 110 is formed of the same material as the first clad layer 104 except the dopant is p-type.

On the other hand, the second compound semiconductor layer 116, as a GaN group III-V nitride compound, is preferably a direct transition type and is doped with a p-type conductive dopant, and more preferably it is a p-GaN layer, but can also be a GaN layer like the first compound semiconductor layer 104, a AlGaN layer including a predetermined ratio of aluminum or indium, or an InGaN layer.

A passivation layer 114 covers an exposed surface of the second clad layer 110 and a portion of both edges of the second compound semiconductor layer 116. A second electrode 118 covers a portion of both side of the passivation layer 114 and an exposed region of the second compound semiconductor layer 116 between the passivation layer 114. The second electrode 118 is a p-type electrode composed of Pd.

Figure 3:
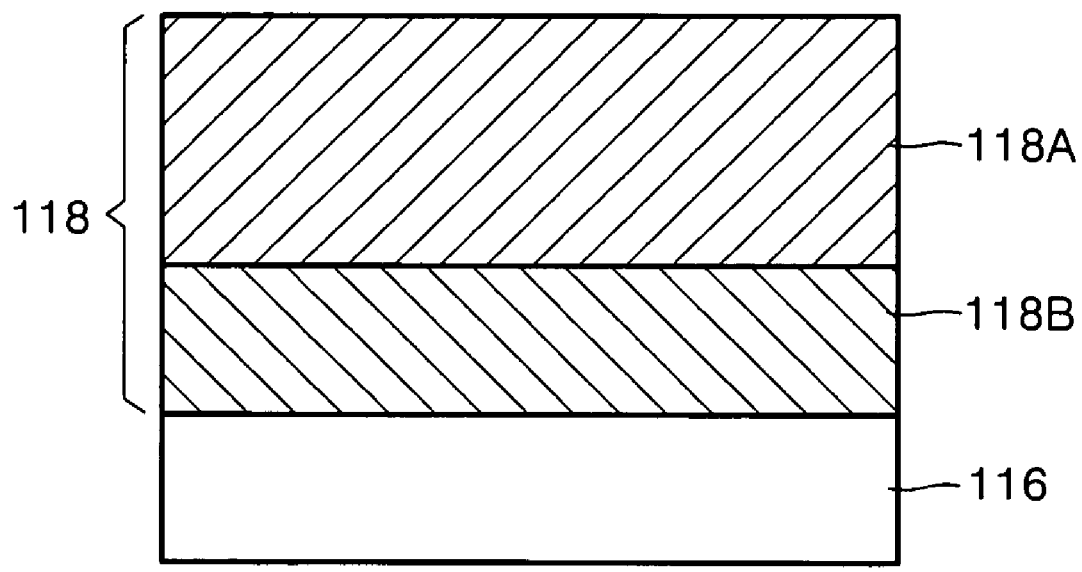
FIG. 3 is a cross-sectional view of an electrode structure of the semiconductor light emitting device depicted in FIG. 2.

FIG. 3 is a cross-sectional view of a p-type second electrode of the semiconductor light emitting device depicted in FIG. 2.

Referring to FIG. 3, the p-type second electrode 118 formed on the second compound semiconductor layer 116 composed of p-type GaN comprises a compound layer 118B composed of Pd—Ga—N and a metal layer 118a composed of Pd.

In the present embodiment, the p-type second electrode 118 is configured to provide a low contact resistance and high reflectance.

Therefore, the compound layer 118B of the p-type second electrode 118 is formed by the following process in order that the p-type second electrode 118 has a low resistance ohmic contact and high reflectance. First, a second compound semiconductor layer 116 is formed by epitaxial growing the p-type GaN on a sapphire substrate having a predetermined shape. Then, a surface of the second compound semiconductor layer 116 is washed using ultrasonic waves in acetone or alcohol.

Next, after forming a metal layer 118A for p-type electrode using an electron beam deposition method, the resultant product is heat treated for about 5 minutes at a temperature of 400~500° C. under a nitrogen atmosphere. That is, a compound layer 118B composed of Pd—Gn—N is formed at an interface between the second compound semiconductor layer 116 and the metal layer 118A by annealing. In the present embodiment, the metal layer 118A composed of Pd is formed to a thickness of approximately 10~5,000 Å.

It was found experimentally that, when annealing, a compound reaction at an interface between the second compound semiconductor layer 116 and the metal layer 118A occurred, forming a trivalent compound layer 118B composed of Pd—Ga—N with a thickness of approximately 22 Å. In the following three cases of annealing, that is, for 7 minutes at temperature of 450° C., for 30 seconds at temperature of 500° C., and for 30 seconds at temperature of 550° C., the formation of the trivalent compound layer 118B having a material composition of Pd—Ga—N are observed.

As a result of annealing, the compound layer 118B composed of trivalent Pd—Ga—N ejects doped Mg ions from the second compound semiconductor layer 116 to the interface contacting the trivalent compound, and then the Mg ions are collected at the interface causing an increase in concentration of Mg ions, thereby reducing resistance.

Referring to FIG. 2 again, at the active layer 108B of the resonance layer 108, electrons injected from the first compound semiconductor layer 104 and holes injected from the second compound semiconductor layer 116 collide, and the electrons and the holes generate light by falling into a lower energy band. The generated light is reflected by the p-type electrode 118, and the reflected light is emitted, sequentially passing through the second compound semiconductor layer 116, the resonance layer 108, the first compound semiconductor layer 104, and the transparent substrate 102.

Figure 4:
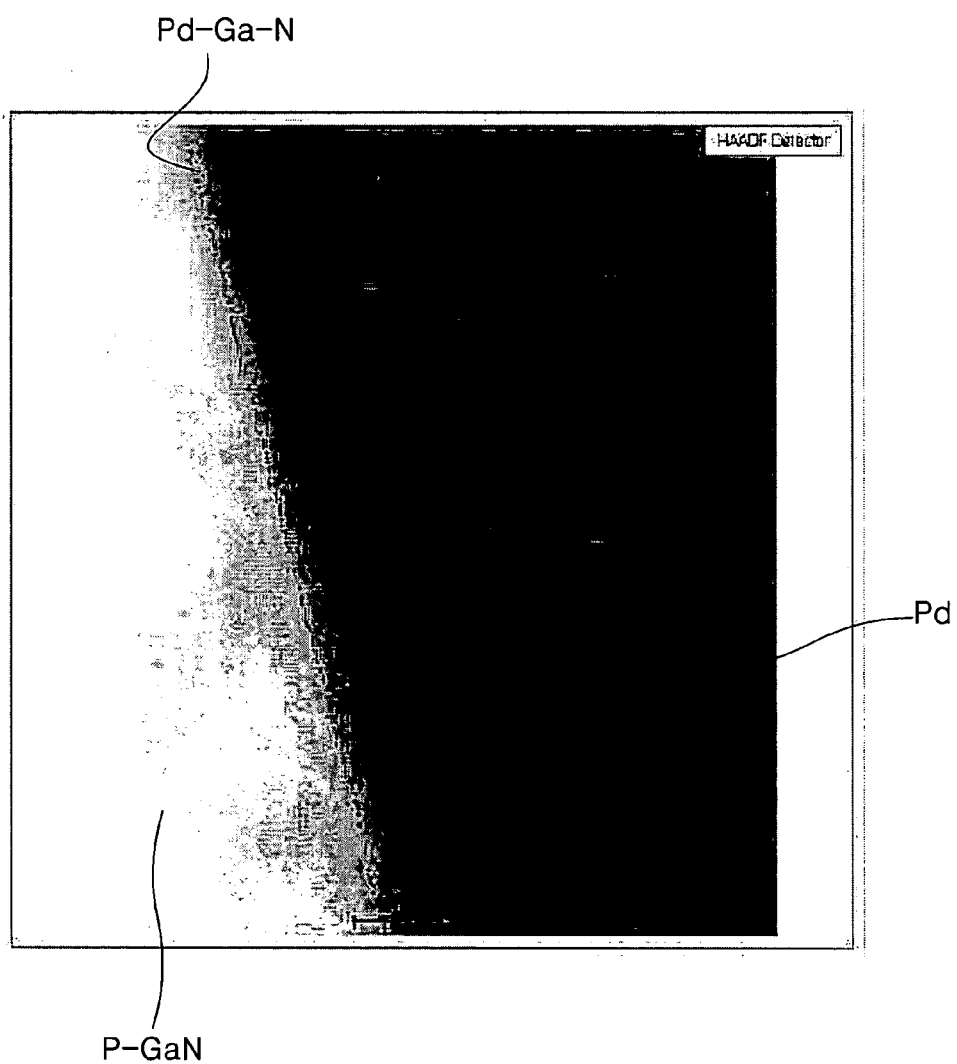
FIG. 4 is a high resolution TEM image illustrating an interface between layers of an electrode structure formed according to an embodiment of the present invention.

FIG. 4 is a high resolution TEM image illustrating an interface between layers of an electrode structure formed according to an exemplary embodiment of the present invention.

Referring to FIG. 4, when performing a heat treatment, a formation of a trivalent compound layer 118B composed of Pd—Ga—N at the interface between a metal layer of a P-type second electrode composed of Pd and the second compound semiconductor layer, can be observed.

Figure 5A:
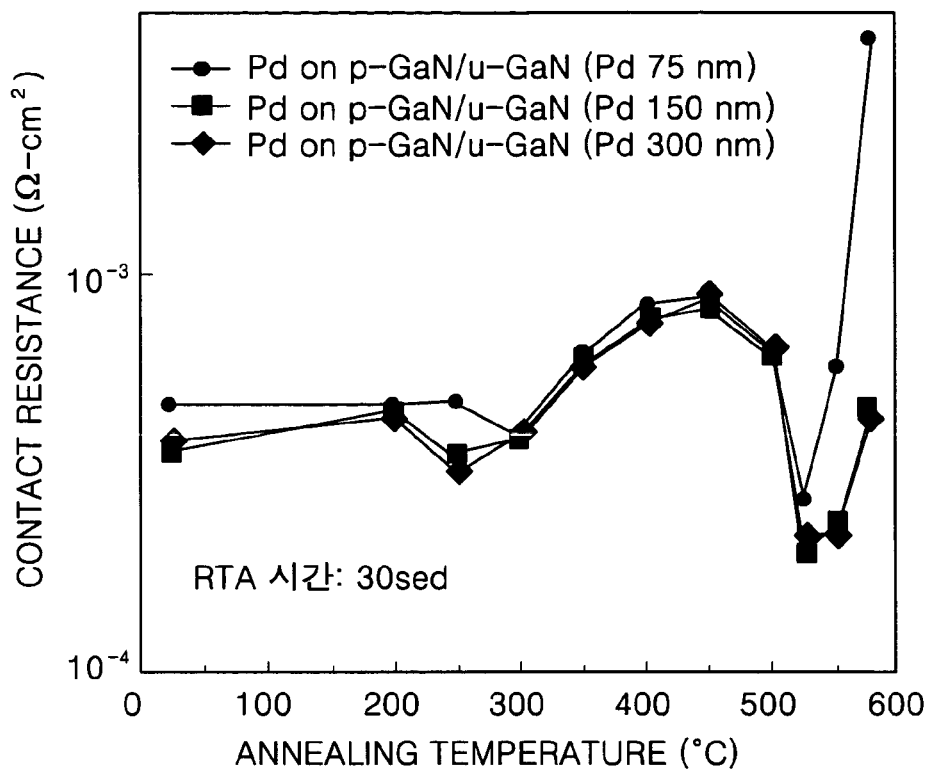
FIG. 5a is a graph showing a variation of contact resistance according to a RTA temperature.

FIG. 5a is a graph illustrating contact resistance with respect to an RTA temperature.

For measuring a variation of contact resistance with respect to the RTA temperature, samples were prepared such that, after forming a second compound semiconductor layer by epitaxial growing an n-GaN as a group III nitride semiconductor layer on a sapphire substrate, metal layers composed of Pd as p-type electrodes with thicknesses of 70 nm, 150 nm, and 300 nm, respectively are formed on the second compound semiconductor layer. Symbols ●, ■, and ◆ represent the samples formed with the thickness of 70 nm, 150 nm, and 300 nm, respectively.

Each of the samples was annealed for 30 seconds at temperature of 100° C., 200° C., 300° C., 450° C., 500° C., 550° C., and 600° C., and then the contact resistances were measured.

Referring to FIG. 5a, the resistance is the highest at a temperature of 450° C., and the lowest at a temperature of 550° C. From this result, it can be inferred that a new phase is formed at temperature of approximately 450° C.

Figure 5B:
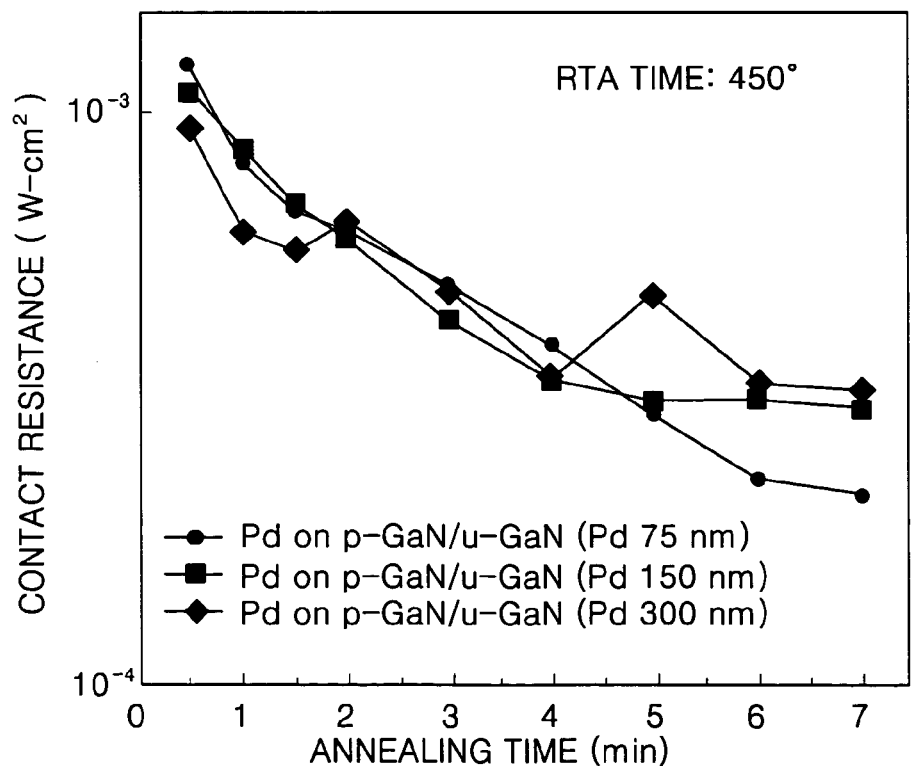
FIG. 5b is a graph showing a variation of contact resistance according to a RTA time.

FIG. 5b is a graph illustrating contact resistance with respect to an RTA time at a fixed RTA temperature of 450° C.

For measuring a variation of contact resistance with respect to the RTA time at the fixed RTA temperature of 450° C., samples were prepared such that, after forming a second compound semiconductor layer by epitaxial growing an n-GaN as a group III nitride semiconductor layer on a sapphire substrate, metal layers composed of Pd as p-type electrodes with thicknesses of 75 nm, 150 nm, and 300 nm, respectively are formed on the second compound semiconductor layer. Symbols ●, ■, and ◆ represent the samples formed with the thickness of 75 nm, 150 nm, and 300 nm, respectively.

Each of the samples was annealed for 30 seconds, 1 minute, 2 minutes, 3 minutes, 4 minutes, 5 minutes, 6 minutes, and 7 minutes at the temperature of 450° C., and then the contact resistances were measured.

Referring to FIG. 5b, the reduction of the contact resistance is largest when the sample having a Pd thickness of 75 nm is annealed for a long time. That is, the contact resistance is the lowest with annealing time is more than 7 minutes.

From this result, it is inferred that a new layer as a p-type ohmic contact layer of the group III nitride semiconductor is formed, and this new layer is a trivalent compound layer composed of Pd—Ga—N.

As described above, according to preferred embodiments of the present invention, a semiconductor light emitting device has a low contact resistance and a high reflectance because of the formation of a trivalent compound layer composed of Pd—Ga—N. The trivalent compound layer is formed by a compound reaction at an interface between a second compound semiconductor layer-composed of p-GaN and a metal layer of the p-type electrode caused by annealing under a nitrogen atmosphere after forming a metal layer for p-type electrode composed of Pd.

Therefore, the semiconductor light emitting device maintains a low operating voltage, thereby minimizing power consumption and heat generation, which in turn increases the lifetime and improves the light emitting characteristics of the semiconductor light emitting device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor light emitting device comprising:
    a transparent substrate;
    an electron injection layer having first and second regions formed on the transparent substrate;
    an active region formed on the first region;
    a hole injection layer formed on the active layer;
    a first electrode structure formed on the second region; and
    a second electrode structure formed on the hole injection layer, and comprising a first layer including nitrogen and a second layer including Pd,
    wherein the first layer of the second electrode structure further comprises Pd and Ga.

2. The semiconductor light emitting device of claim 1, wherein the first layer is interposed between the hole injection layer and the second layer.

3. The semiconductor light emitting device of claim 1, wherein the hole injection layer is a layer selected from the group consisting of a p-type material layer and an undoped material layer.

4. The semiconductor light emitting device of claim 3, wherein the hole injection layer is composed of a material selected from the group consisting of n-GaN, GaN, AlGaN, and InGaN.

5. An electrode structure used for a semiconductor light emitting device comprising a hole injection layer, comprising:
 a first layer comprising Pa—Ga—N; and
 a second layer comprising Pd.

6. The semiconductor light emitting device of claim 5, wherein the first layer comprising Pa—Ga—N is interposed between the hole injection layer and the second layer that includes Pd.

7. The semiconductor light emitting device of claim 5, wherein the hole injection layer is a layer selected from the group consisting of a p-type material layer and the undoped material layer.

8. The semiconductor light emitting device of claim 7, wherein the hole injection layer is composed of a material selected from the group consisting of n-GaN, GaN, AlGaN, and InGaN.

* * * * *